(12) United States Patent
Hughes

(10) Patent No.: US 8,604,610 B1
(45) Date of Patent: Dec. 10, 2013

(54) FLEXIBLE POWER MODULE SEMICONDUCTOR PACKAGES

(75) Inventor: Duane A. Hughes, Saline, MI (US)

(73) Assignee: Fairchild Semiconductor Corporation, San Jose, CA (US)

( * ) Notice: Subject to any disclaimer, the term of this patent is extended or adjusted under 35 U.S.C. 154(b) by 35 days.

(21) Appl. No.: 13/495,916

(22) Filed: Jun. 13, 2012

(51) Int. Cl.
*H01L 23/34* (2006.01)

(52) U.S. Cl.
USPC .... 257/724; 257/675; 257/706; 257/E23.065; 257/E23.066; 257/E23.068; 257/E23.106

(58) Field of Classification Search
USPC .......... 257/724, 675, 706, E23.065, E23.066, 257/E23.068, E23.106
See application file for complete search history.

(56) References Cited

U.S. PATENT DOCUMENTS

| | | | |
|---|---|---|---|
| 6,432,750 B2 | 8/2002 | Jeon et al. | |
| 7,061,080 B2 | 6/2006 | Jeun et al. | |
| 7,208,819 B2 | 4/2007 | Jeun et al. | |
| 7,449,774 B1 | 11/2008 | Jeun et al. | |
| 7,501,700 B2 | 3/2009 | Jeun et al. | |
| 7,576,995 B2 | 8/2009 | Thomas et al. | |
| 7,659,559 B2 | 2/2010 | Lee | |
| 7,675,148 B2 | 3/2010 | Lim et al. | |
| 7,687,903 B2 | 3/2010 | Son et al. | |
| 7,701,048 B2 | 4/2010 | Lee et al. | |
| 7,706,146 B2 | 4/2010 | Lee et al. | |
| 7,714,428 B2 | 5/2010 | Lee et al. | |
| 7,800,224 B2 | 9/2010 | Lee et al. | |
| 7,842,545 B2 | 11/2010 | Lee | |
| 7,846,779 B2 | 12/2010 | Yang | |
| 7,847,395 B2 | 12/2010 | Baek | |
| 7,859,528 B2 | 12/2010 | Cho et al. | |
| 7,871,848 B2 | 1/2011 | Lee | |
| 7,936,054 B2 | 5/2011 | Eom et al. | |
| 7,951,645 B2 | 5/2011 | Lee et al. | |
| 7,952,317 B2 | 5/2011 | Suh | |
| 7,986,531 B2 | 7/2011 | Lee et al. | |
| 8,013,431 B2 | 9/2011 | Lee | |
| 8,027,183 B2 | 9/2011 | Cho et al. | |
| 8,525,338 B2 * | 9/2013 | Sato et al. | 257/746 |

* cited by examiner

*Primary Examiner* — Tu-Tu Ho
(74) *Attorney, Agent, or Firm* — Kenneth E. Horton; Kirton McConkie

(57) ABSTRACT

Power module semiconductor packages that contain a flexible circuit board and methods for making such packages are described. The semiconductor package contain a flexible circuit board, a conductive film on a first portion of the upper surface of the flexible circuit board, a land pad on a second portion of the upper surface of the flexible circuit board, a heat sink on a portion of the bottom surface of the flexible circuit board, a passive component, a discrete device, or an IC device connected to a portion of the conductive film, and a lead of a lead frame connected to the land pad. These packages can have a high degree of design flexibility of the layout of the package and simpler routing designs, reducing the time to design the packages and reducing the costs of the packages. Other embodiments are also described.

20 Claims, 3 Drawing Sheets

FLEXIBLE POWER MODULE SEMICONDUCTOR PACKAGES

FIELD

This application relates generally to semiconductor packages and methods for making such packages. More specifically, this application describes power module semiconductor packages that contain a flexible circuit board and methods for making such packages.

BACKGROUND

Semiconductor packages are well known in the art. Often, these packages may include one or more semiconductor devices, such as an integrated circuit ("IC") die, which may be connected to a die pad that is centrally formed in a lead frame. In some cases, bond wires electrically connect the IC die to a series of terminals that serve as an electrical connection to an external device, such as a printed circuit board ("PCB"). An encapsulating material can be used to cover the bond wires, the IC die, the terminals, and/or other components to form the exterior of the semiconductor package. A portion of the terminals and possibly a portion of the die pad may be externally exposed from the encapsulating material. In this manner, the die may be protected from environmental hazards—such as moisture, contaminants, corrosion, and mechanical shock—while being electrically and mechanically connected to an intended device that is external to the semiconductor package.

After it has been formed, the semiconductor package is often used in an ever growing variety of electronic applications, such as disk drives, USB controllers, portable computer devices, cellular phones, and so forth. Depending on the electronic application, the semiconductor package may be highly miniaturized and may need to be as small as possible.

SUMMARY

This application relates to power module semiconductor packages that contain a flexible circuit board and methods for making such packages. The semiconductor package contain a flexible circuit board, a conductive film on a first portion of the upper surface of the flexible circuit board, a land pad on a second portion of the upper surface of the flexible circuit board, a heat sink on a portion of the bottom surface of the flexible circuit board, a passive component, a discrete device, or an IC device connected to a portion of the conductive film, and a lead of a lead frame connected to the land pad. These packages can have a high degree of design flexibility of the layout of the package and simpler routing designs, reducing the time to design the packages and reducing the costs of the packages.

BRIEF DESCRIPTION OF THE DRAWINGS

The following description can be better understood in light of the Figures, in which.

Figure 1:
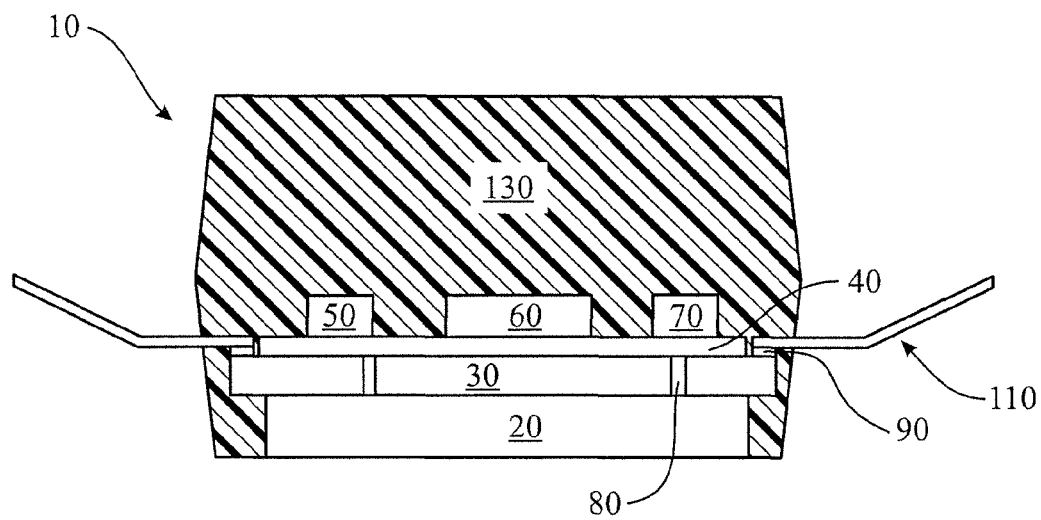
FIG. 1 shows some embodiments of a power module semiconductor package with molding.

The Figures illustrate specific aspects of the power modules semiconductor packages and methods for making such packages. Together with the following description, the Figures demonstrate and explain the principles of the methods and structures produced through these methods. In the drawings, the thickness of layers and regions are exaggerated for clarity. The same reference numerals in different drawings represent the same element, and thus their descriptions will not be repeated. As the terms on, attached to, or coupled to are used herein, one object (e.g., a material, a layer, a substrate, etc.) can be on, attached to, or coupled to another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

DETAILED DESCRIPTION

The following description supplies specific details in order to provide a thorough understanding. Nevertheless, the skilled artisan would understand that the semiconductor devices and associated methods of using the devices can be implemented and used without employing these specific details. Indeed, the devices and associated methods can be placed into practice by modifying the illustrated devices and associated methods and can be used in conjunction with any other apparatus and techniques conventionally used in the industry. For example, while the description below focuses on methods for making for semiconductor packages in the IC industry, it could be used for and applied to other electronic devices like automotive or white good modules, optoelectronic devices, solar cells, MEMS structures, lighting controls, power supplies, and amplifiers.

Some embodiments of the power module semiconductor packages that contain a flexible circuit board and methods for making such packages are shown in the Figures. In the embodiments shown in FIG. 1 (a view with encapsulation), FIG. 2 (a view without encapsulation), and FIG. 3 (top view), the semiconductor package 10 contains a heat sink 20, a flexible circuit board 30, a conductive film 40, a passive component(s) 50, a driver IC device(s) 60, an IC device(s) 70, pads 90, and a lead frame 110.

The package 10 can contain one or more IC devices 70. Where there are multiple IC devices, they may be the same or different and may be any known integrated circuit in the art. Some non-limiting examples of these integrated circuits include zener diodes, schottky diodes, small signal diodes, bipolar junction transistors ("BJT"), metal-oxide-semiconductor field-effect transistors ("MOSFET"), insulated-gate-bipolar transistors ("IGBT"), insulated-gate field-effect transistors ("IGFET"), inductors, capacitors, or other passive devices or combinations thereof. The package 10 can also contain either a single driver IC device 60 or multiple driver IC devices 134. Any driver IC device known in the art can be used in the package 100. Examples of the discrete devices include MOSFETs, IGBTs, or combinations thereof. In some embodiments, the driver IC device 60 comprises bipolar or CMOS control circuitry which can be used to control the switching of the discrete devices.

The package 10 can also contain either a single passive component 50 or multiple passive components 50. Any passive component known in the art can be used in the package 100, including capacitors, inductors, resistors, filters, compactors, operational amplifiers, diodes, or combinations thereof. In some embodiments, the passive component 50 comprises a diode that is used to control the flow of current.

The semiconductor package 10 also contains a heat sink on a portion or all of the bottom of the package 10. The heat sink 20 can be used to dissipate the heat that is generated within the package 10 during operation. Any heat conducting material known in the art can be used in the heat sink, such as Cu, ceramic materials, insulated metal substrate, or combinations thereof. The heat sink 20 can be configured with any shape and size consistent with its use in the semiconductor package 10. The heat sink 20 can also have any thickness that provides the needed support and thermal transfer for the semiconductor package 10.

The semiconductor package 10 also contains leads 110 of a lead frame. The leadframe supports the package, serves as part of the input/output (I/O) interconnection system, and also provides a thermally conductive path for dissipating some of the heat generated during operation. The material of the leadframe can comprise any conductive metal or metal alloy known in the art, including Cu, Ni—Pd, Fe, Fe alloy, Ni—Pd—Au, Ni—Pd—Au/Ag, or combinations thereof. In some embodiments, the leadframe comprises Cu with Ni—Au or Ni—Ag plating. In some configurations, the leadframe can contain a layer of metal plating (not shown) if desired. For example, the leadframe (or lead frames) 10 may be electroplated or otherwise coated with a layer of a solderable conductive material, such as tin, gold, lead, silver, and/or another solderable material.

Figure 2:
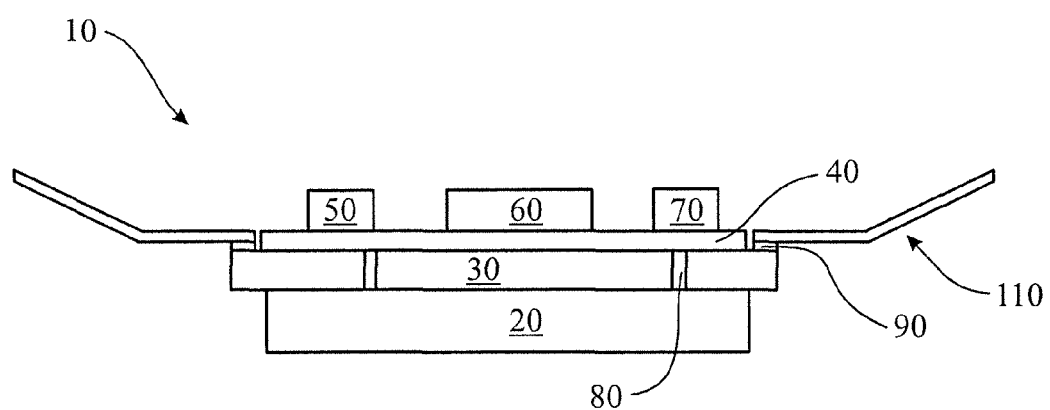
FIG. 2 shows some embodiments of a power module semiconductor package without molding.
Figure 3:
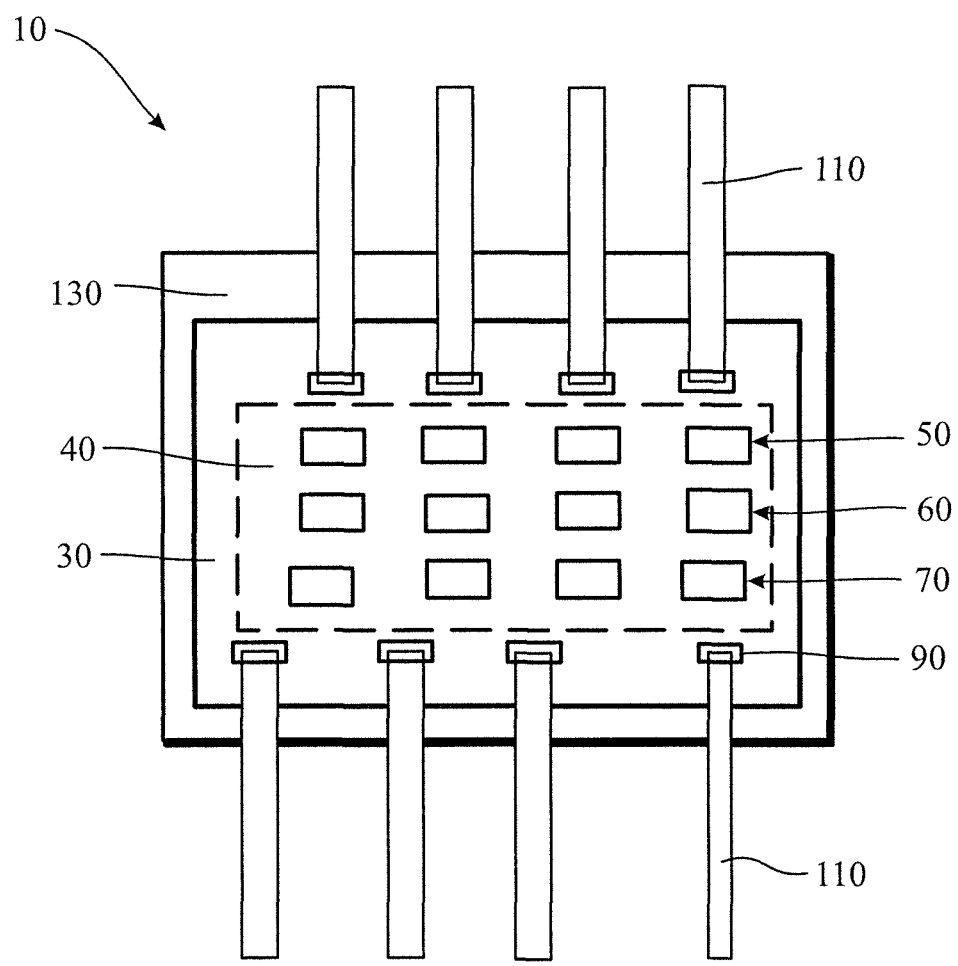
FIG. 3 shows a top view of some embodiments of a power module semiconductor package.

The semiconductor package 10 also contains a flexible circuit board (FCB) 30, as shown in FIGS. 1 and 2. In some embodiments, the FCB comprises a flexible circuit in substantially the shape of a board. In some configurations, the flexible circuit contains a patterned arrangement of printed wiring utilizing flexible base material that optionally contains a flexible cover layer. The cover layer can be an adhesive-based flexible film which is provided with holes to allow for access to interconnection points and laminated using heat and pressure to the flexible circuit to protect against physical and electrical mishaps during assembly and in use (i.e., shorting).

Figure 5:
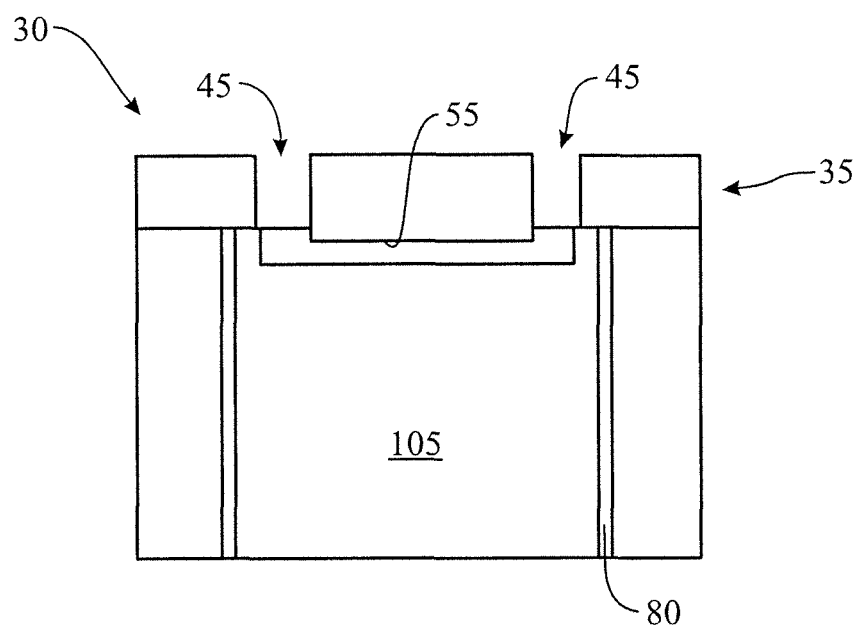
FIG. 5 depicts some embodiments of a flexible circuit board that can be used in a power module semiconductor package.

The FCB 30 can have any configuration in the semiconductor package 10 that allows it to route the electrical signals in the desired manner to and from the passive component 50, the driver IC device 60, the IC device 70, and the lead frame 110. In some configurations, the FCB 30 can have the configuration illustrated in FIG. 5. In FIG. 5, the FCB 30 contains any flexible substrate (or base) material 105 that is not substantially conducting. In some embodiments, the substrate material can comprise polyimide or suitable materials known in the art.

As shown in FIG. 5, the FCB 30 contains a cover layer 35. The cover layer 35 can be made of any adhesive-based flexible film, such as Dupont's KAPTON tape or suitable materials known in the art. The cover layer 35 can be laminated using heat and pressure to the substrate 105 and protects the substrate 105 against physical and electrical mishaps during assembly. The cover layer 35 can be patterned to contain holes 45 to allow for access to interconnection points from the passive component 50, the driver IC device 60, and the IC device 70, or to form areas of electrical isolation or connections as may be suitable to a particular application.

The FCB 30 in FIG. 5 also contains vias 80. The vias can used to conduct heat away from the passive component 50, the driver IC device 60, and the IC device 70. The vias 80 may contain any heat conducting material, including Cu or Cu alloys. The FCB 30 also contains metal traces 55 that can be used to interconnect the passive component 50, the driver IC 60, the IC device 70 and the leads 110. The metal traces can be made of a conductive material, such as Cu or Cu alloy with any thickness providing the desired interconnection.

The leads 110 of the leadframe are connected to the FCB 30 semiconductor package 10 using pads 90. In some embodiments, the pads 90 can comprise any bond pads known in the semiconductor art. For example, the pads 90 could comprise a metal stud and a reflowed solder material or metal deposit like Au, Ni, and Ag. To enhance the bond between the leads 110 and the FCB 30, the pads 90 may be formed with uneven surfaces so that the metal stud of the pads tightly adheres to the leads 110 and the FCB 30. The pads 90 are configured to substantially match the components to which they are respectively attached. Accordingly, the pads 90 can be configured to substantially match the parts of the leads 110 and the FCB 30 to which they will be attached.

The components of the semiconductor package 10, except the bottom of the heat sink 20 and portions of the leads 110, can be encapsulated in any molding material 130 known in the art, as shown in FIG. 1. In some embodiments, the molding material can comprise an epoxy molding compound, a thermoset resin, a thermoplastic material, or potting material. In other embodiments, the molding material comprises an epoxy molding compound. In FIG. 2, the molding material 130 is not shown to better illustrate the internal components of semiconductor package 100.

Figure 4:
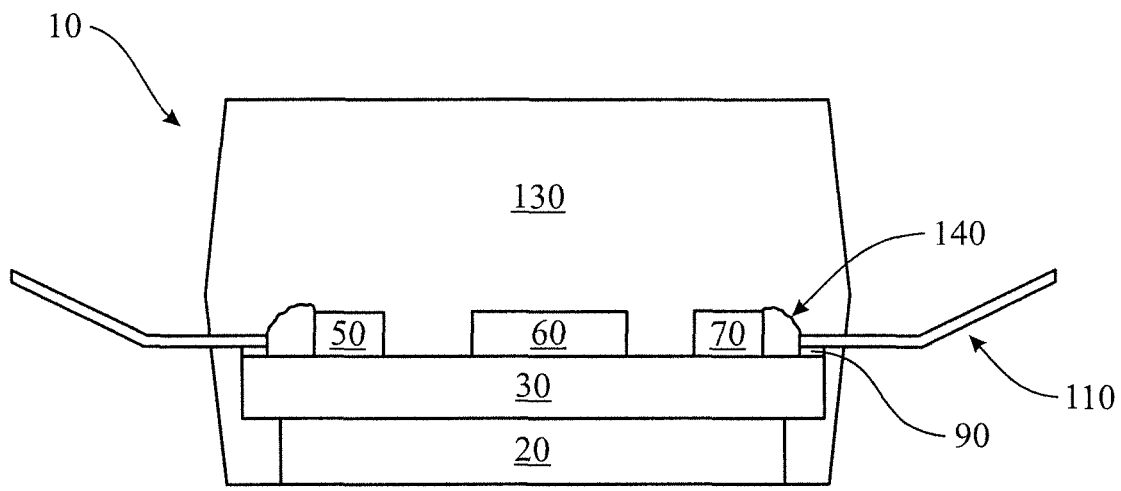
FIG. 4 shows some embodiments of a power module semiconductor package that use bond wires.

In the embodiments illustrated in FIG. 4, the components of the semiconductor package can be arranged so that the passive component 50, the driver IC device 60, the IC device 70 are connected using wire bonding, rather than the flip-chip connection method shown in FIG. 1. In these embodiments, the wire bonds 140 are used to route the electrical signals from the passive component 50, the driver IC device 60, the IC device 70 to the leads 110. In these embodiments, because of the presence of the wire bonds, the conductive film 40 is optional and so can be omitted. The optional conductive film 40 can be utilized as an additional thermal dissipation material. As well, the FCB 30 need not contain the metal traces 55 and the cover layer 35 need not contain the holes 45.

The semiconductor package 100 can be made using any known process that provides the structures described above and/or as illustrated in the Figures. In some embodiments, the methods described herein can be used, although these processes need not be performed in the exact sequence described below.

The method begins by providing the material for the FCB substrate 105. Depending on the material used, the substrate 105 can be provided by forming a polyimide, or other suitable material into an appropriate form factor. The vias 80 and the metal traces 55 can then be formed on the substrate 105 with the desired interconnect pattern for the passive component 50, the driver IC 60, and the IC device 70 in mind. Next, the cover layer 35 can be provided on the surface of the substrate 105 using any process, followed by forming the holes 45 in the cover layer 35. The conductive film 40 can then be provided on the surface of the cover layer 35, filling in the holes. The heat sink 20 can then be provided on desired location of the bottom of the FCB 30.

The pads 90 can then be formed on the location where they will provide the interconnection to the lands 110 of the lead frame. In some embodiments, the pads 90 can be formed by depositing the material and then etching the undesired portions of that material, thereby forming the pads 90 with the desired shape.

The passive component 50, the driver IC 60, and the IC device 70 can then be prepared. In some embodiments, the passive component 50, the driver IC 60, the IC device 70 can be manufactured separately. But in other embodiments, they are manufactured at the same time by using semiconductor processes.

The passive component 50, the driver IC 60, and the IC device 70 can then be placed on the desired location of the conductive film 40. These components can then be attached to the conductive film 40 using a flip-chip process with solder bumping, which may include the use of solder bumps, balls, studs, and combinations thereof along with a solder paste, followed by a cure orreflow process. In other embodiments, the attachment process includes a flip chip process with the use of a conductive adhesive that may be, for example, a conductive epoxy, a conductive film, a screen printable solder paste, or a solder material, such as a lead-containing solder or a lead-free solder. In the embodiments of FIG. 4, this attachment can be performed by any wire bonding process.

The lead frame containing the leads 100 can then be formed and connected to the pads 90. The resulting structure can then be encapsulated with the molding material 130. The molding material 130 can be formed around all of these components, with the exception of parts of the leads 110 and the bottom of the heat sink 20. Alternatively, the heat sink 20 can be omitted from the package and the molding material 130 can be formed around the components so as to further protect from harsh environments. The resulting semiconductor package 100 is then optionally marked and singulated.

These power module semiconductor packages contain a FCB that are connected to the passive component 50, the driver IC 60, and the IC device 70. Some conventional semiconductor packages instead contain a DBC (direct bonded copper on ceramic), an IMS (Insulated Metal Substrate), PCB (printed circuit board), or just a leadframe with a ceramic heatsink attached with a non-conductive adhesive. The FCB provides an improved degree of design flexibility of the layout of the package and simpler routing designs. These features, in turn, reduce the time to design the packages and also reduce the costs of the packages.

In some embodiments, the power module semiconductor packages can be formed by providing a flexible circuit board, providing a conductive film on a first portion of the upper surface of the flexible circuit board, providing a land pad on a second portion of the upper surface of the flexible circuit board, providing multiple semiconductor devices connected to a portion of the conductive film, and providing a lead of a lead frame connected to the land pad.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A semiconductor package, comprising:
   a flexible circuit board;
   a conductive film on a first portion of the upper surface of the flexible circuit board;
   a land pad on a second portion of the upper surface of the flexible circuit board;
   multiple semiconductor devices connected to a portion of the conductive film; and
   a lead of a lead frame connected to the land pad.

2. The package of claim 1, further comprising a heat sink on a portion of the bottom surface of the flexible circuit board.

3. The semiconductor package of claim 2, wherein the flexible circuit board comprises vias for conducting the heat generated by the multiple semiconductor devices to the heat sink.

4. The semiconductor package of claim 1, wherein the flexible circuit board comprises a conductive pattern for routing the electrical signals from the multiple semiconductor devices to the lead.

5. The semiconductor package of claim 3, wherein the conductive pattern is formed on a flexible base material.

6. The semiconductor package of claim 4, wherein the flexible circuit board further comprise a flexible cover layer on the base material.

7. The semiconductor package of claim 1, wherein the multiple semiconductor devices comprises a MOSFET device.

8. The semiconductor package of claim 1, wherein the multiple semiconductor devices comprises an IC driver device.

9. The semiconductor package of claim 1, wherein the multiple semiconductor devices comprise a passive component.

10. The semiconductor package of claim 1, further comprising a molding material which leaves a portion of the leads exposed and a portion of the heat sink exposed.

11. A semiconductor package, comprising:
    a flexible circuit board;
    a conductive film on a first portion of the upper surface of the flexible circuit board;
    a land pad on a second portion of the upper surface of the flexible circuit board;
    multiple semiconductor devices connected to a portion of the conductive film;
    a lead of a lead frame connected to the land pad; and
    a heat sink on a portion of the bottom surface of the flexible circuit board;
    wherein the flexible circuit board comprises vias for conducting the heat generated by the multiple semiconductor devices to the heat sink.

12. The semiconductor package of claim 11, wherein the flexible circuit board comprises a conductive pattern for routing the electrical signals from the multiple semiconductor devices to the lead.

13. The semiconductor package of claim 12, wherein the conductive pattern is formed on a flexible base material.

14. The semiconductor package of claim 13, wherein the flexible circuit board further comprise a flexible cover layer on the base material.

15. The semiconductor package of claim 11, wherein the multiple semiconductor devices comprises a MOSFET device.

16. The semiconductor package of claim 11, wherein the multiple semiconductor devices comprises an IC driver device.

17. The semiconductor package of claim 11, wherein the multiple semiconductor devices comprise a passive component.

18. The semiconductor package of claim 11, further comprising a molding material which leaves a portion of the leads exposed and a portion of the heat sink exposed.

19. A semiconductor package, comprising:
- a flexible circuit board comprising a flexible base material and a conductive pattern for routing electrical signals formed on the base material;
- a conductive film on a first portion of the upper surface of the flexible circuit board;
- a land pad on a second portion of the upper surface of the flexible circuit board;
- multiple semiconductor devices connected to a portion of the conductive film;
- a lead of a lead frame connected to the land pad; and
- a heat sink on a portion of the bottom surface of the flexible circuit board;
- wherein the flexible circuit board comprises vias for conducting the heat generated by the multiple semiconductor devices to the heat sink.

20. The semiconductor package of claim 19, wherein the conductive pattern routes the electrical signals from the multiple semiconductor devices to the lead.

\* \* \* \* \*